United States Patent
Sung

(10) Patent No.: US 11,031,934 B2
(45) Date of Patent: Jun. 8, 2021

(54) CONNECTION CIRCUIT AND CONNECTION METHOD THEREOF

(71) Applicant: Realtek Semiconductor Corporation, Hsinchu (TW)

(72) Inventor: Ya-Hsuan Sung, Taipei (TW)

(73) Assignee: REALTEK SEMICONDUCTOR CORPORATION, Hsinchu (TW)

(*) Notice: Subject to any disclaimer, the term of this patent is extended or adjusted under 35 U.S.C. 154(b) by 0 days.

(21) Appl. No.: 16/708,542

(22) Filed: Dec. 10, 2019

(65) Prior Publication Data
US 2020/0204176 A1 Jun. 25, 2020

(30) Foreign Application Priority Data
Dec. 25, 2018 (TW) .................................. 107147019

(51) Int. Cl.
*H03K 17/687* (2006.01)
*G01R 31/26* (2020.01)

(52) U.S. Cl.
CPC ....... *H03K 17/687* (2013.01); *G01R 31/2617* (2013.01)

(58) Field of Classification Search
CPC .......................... H03K 17/687; G01R 31/2617
USPC .................................................. 327/108–112
See application file for complete search history.

(56) References Cited

U.S. PATENT DOCUMENTS

| | | | | |
|---|---|---|---|---|
| 4,295,087 A * | 10/1981 | Morishita | ............. | H02J 7/1461 320/134 |
| 8,904,054 B2 * | 12/2014 | Kuroiwa | ................. | G06F 1/266 710/14 |
| 8,949,631 B2 * | 2/2015 | Chen | ....................... | G06F 1/266 713/300 |
| 2011/0016334 A1 * | 1/2011 | Tom | ....................... | G06F 1/266 713/300 |
| 2013/0049678 A1 * | 2/2013 | Li | ............................ | H02J 7/04 320/107 |
| 2014/0211513 A1 * | 7/2014 | Sakita | ................. | H02M 3/1584 363/16 |
| 2014/0240966 A1 * | 8/2014 | Garcia | ....................... | F21S 9/02 362/183 |
| 2016/0127828 A1 * | 5/2016 | Maher | ...................... | H04R 5/04 381/94.1 |
| 2016/0191037 A1 * | 6/2016 | Luo | ..................... | H04L 25/4906 327/108 |
| 2016/0349814 A1 * | 12/2016 | Carpenter, Jr. | ........ | G06F 13/385 |
| 2018/0013300 A1 * | 1/2018 | Yao | ................... | H02M 3/33523 |

(Continued)

*Primary Examiner* — Adam D Houston
(74) *Attorney, Agent, or Firm* — Locke Lord LLP; Tim Tingkang Xia, Esq.

(57) ABSTRACT

The present disclosure relates to a connection circuit including a first circuit and a second circuit. The first circuit includes a first impedance unit. The first impedance unit is electrically connected to a first detecting terminal of an electronic device for receiving a first voltage. The second circuit includes a second impedance unit. The second impedance unit is electrically connected to a second detecting terminal of the electronic device. The second impedance unit includes a transistor switch. A control terminal of the transistor switch is electrically connected to the first circuit such that the transistor switch is turned on according to the first voltage, and the second circuit receives a second voltage transmitted from the second detecting terminal.

12 Claims, 4 Drawing Sheets

(56) References Cited

U.S. PATENT DOCUMENTS

2019/0348961 A1* 11/2019 Lim ........................ H03F 3/195
2020/0204176 A1* 6/2020 Sung .............. H03K 19/017509

* cited by examiner

US 11,031,934 B2

CONNECTION CIRCUIT AND CONNECTION METHOD THEREOF

CROSS-REFERENCE TO RELATED APPLICATION

This application claims priority to Taiwan Application Serial Number 107147019, filed Dec. 25, 2018, which is herein incorporated by reference in its entirety.

BACKGROUND

Technical Field

The present disclosure relates to a connection circuit, and more particularly to a circuit for electrically connecting to an electronic device in order that the electronic device determines how the signal is processed.

Description of Related Art

A connection circuit is an important channel for transmitting power or data in various electronic devices. There are many interface standards for transmission circuits and common specifications such as universal serial bus (USB), Lightning, etc.

When an electronic device and an external device perform data or power transmission, both the electronic device and the external device must be configured with a connection circuit. After the electronic device is electrically connected to the connection circuit of the external device, the electronic device determines the type of the external device according to an electrical characteristics in the connection circuit, and then performs corresponding signal transmission. However, there are still many issues need to be improved to the connection circuit.

SUMMARY

One aspect of the present disclosure is a connection circuit. The connection circuit includes a first circuit and a second circuit. The first circuit includes a first impedance unit. The first impedance unit is electrically connected to a first detecting terminal of an electronic device to receive a first voltage. The second circuit includes a second impedance unit. The second impedance unit is electrically connected to a second detecting terminal of the electronic device to receive a second voltage. The second impedance unit includes a transistor switch. A control terminal of the transistor switch is electrically connected to the first circuit, so that the transistor switch is turned on according to the first voltage.

Another aspect of the present disclosure is a connection method for a connection circuit, including the following steps. Electrically connecting a first circuit and a second circuit, so that a first impedance unit of the first circuit is electrically connected to a control terminal of a transistor switch of the second circuit. Receiving a first voltage from an electronic device through the first impedance unit. Turning on the transistor switch according to the first voltage. Receiving a second voltage from the electronic device through the second circuit.

It is to be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

For the embodiment below is described in detail with the accompanying drawings, embodiments are not provided to limit the scope of the present disclosure. Moreover, the operation of the described structure is not for limiting the order of implementation. Any device with equivalent functions that is produced from a structure formed by a recombination of elements is all covered by the scope of the present disclosure. Drawings are for the purpose of illustration only, and not plotted in accordance with the original size.

It will be understood that when an element is referred to as being "connected to" or "coupled to", it can be directly connected or coupled to the other element or intervening elements may be present. In contrast, when an element to another element is referred to as being "directly connected" or "directly coupled," there are no intervening elements present. As used herein, the term "and/or" includes an associated listed items or any and all combinations of more.

Figure 1:
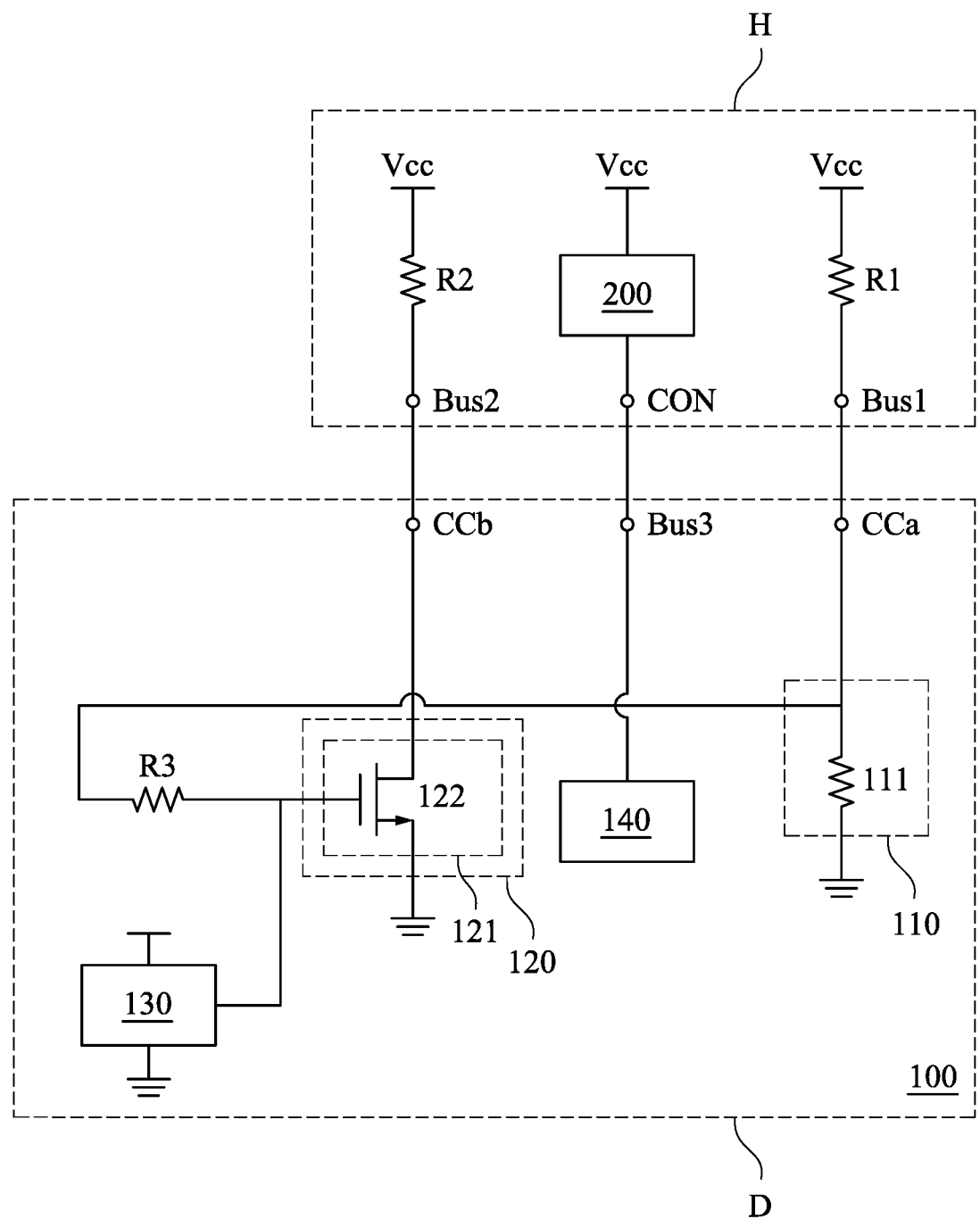
FIG. 1 is a schematic diagram of a connection circuit in some embodiments of the present disclosure.

The present disclosure relates to a connection circuit 100. Referring to FIG. 1, which is a schematic diagram of one embodiment of connection circuit 100. The connection circuit 100 includes a first circuit 110 and a second circuit 120. In some embodiments, the connection circuit 100 is arranged in an external device D (device side), and is configured to electrically connected to a detection circuit of an electronic device H (host side). The electronic device H may determine the type of external device D corresponding to connection circuit 100 according to the electrical characteristics (such as voltage change) in the detection circuit to perform the corresponding actions, such as providing power.

In some embodiments, the first circuit 110 is electrically connected to the first electrical terminal CCa of the external device D, and includes a first impedance unit 111. The first electrical terminal CCa is electrically connected to the first detecting terminal Bus1 of the electronic device H for receiving a first voltage provided by the electronic device H. In FIG. 1, the first impedance unit 111 is shown as a resistor, but the disclosure is not limited thereto.

The second circuit 120 is electrically connected to the second electrical terminal CCb of the external device D, including a second impedance unit 121. The second electrical terminal CCb is electrically connected to the second detecting terminal Bus2 of the electronic device H to receive a second voltage provided by the electronic device H. The second impedance unit 121 includes a transistor switch 122. Two terminals of the transistor switch 122 are electrically connected to the second electrical terminal CCb and a ground terminal, respectively, and the control terminal of the transistor switch 122 is electrically connected to the first circuit 110. In some embodiments, the control terminal of the transistor switch 122 is electrically connected to a node between the first electrical terminal CCa and the first impedance unit 111.

Figure 2A:
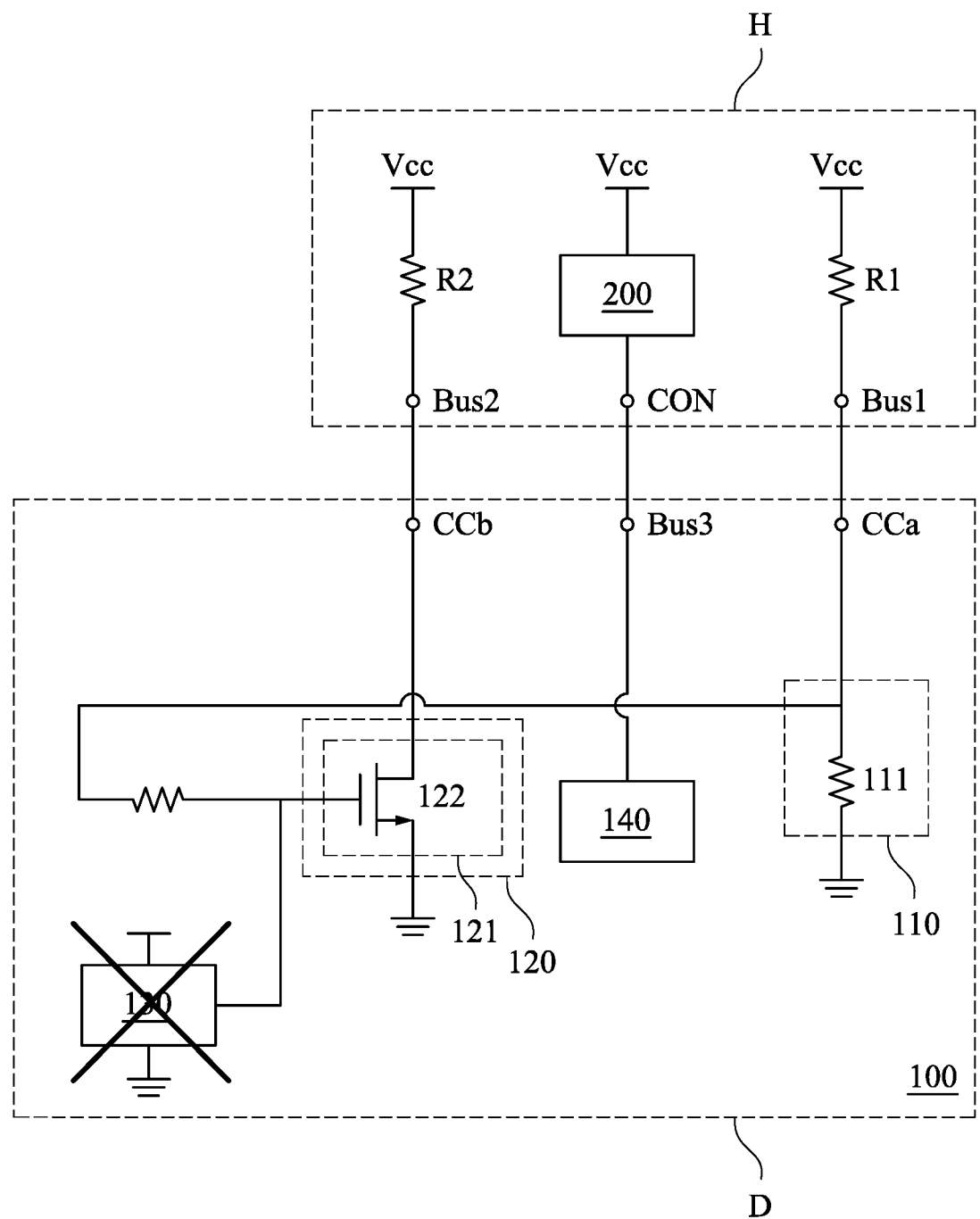
FIG. 2A is a schematic diagram of a connection circuit in the first state in some embodiments of the present disclosure.

Referring to FIG. 2A, when the first electrical terminal CCa is electrically connected to the first detecting terminal Bus1 and the second electrical terminal CCb is electrically connected to the second detecting terminal Bus2, the power supply Vcc in the electronic device H generates a first voltage on the first electrical terminal CCa and the first detecting terminal Bus1 according to the Voltage divider rule. The power supply Vcc in the electronic device H generates a second voltage on the second electrical terminal CCb and the second detecting terminal Bus2. In addition, the control terminal of the transistor switch 122 may also receive the first voltage, and is accordingly turned on. In some embodiments, as shown in FIG. 2A, when the external device D does not need to receive power from the electronic device H (e.g., the external device D is a headphone), the transistor switch 122 must be turned on, so that the second circuit 120 has a predetermine second impedance value. After the electronic device H detects the second impedance through the second electrical terminal CCb, the electronic device H will not transmit power to the external device D.

Figure 2B:
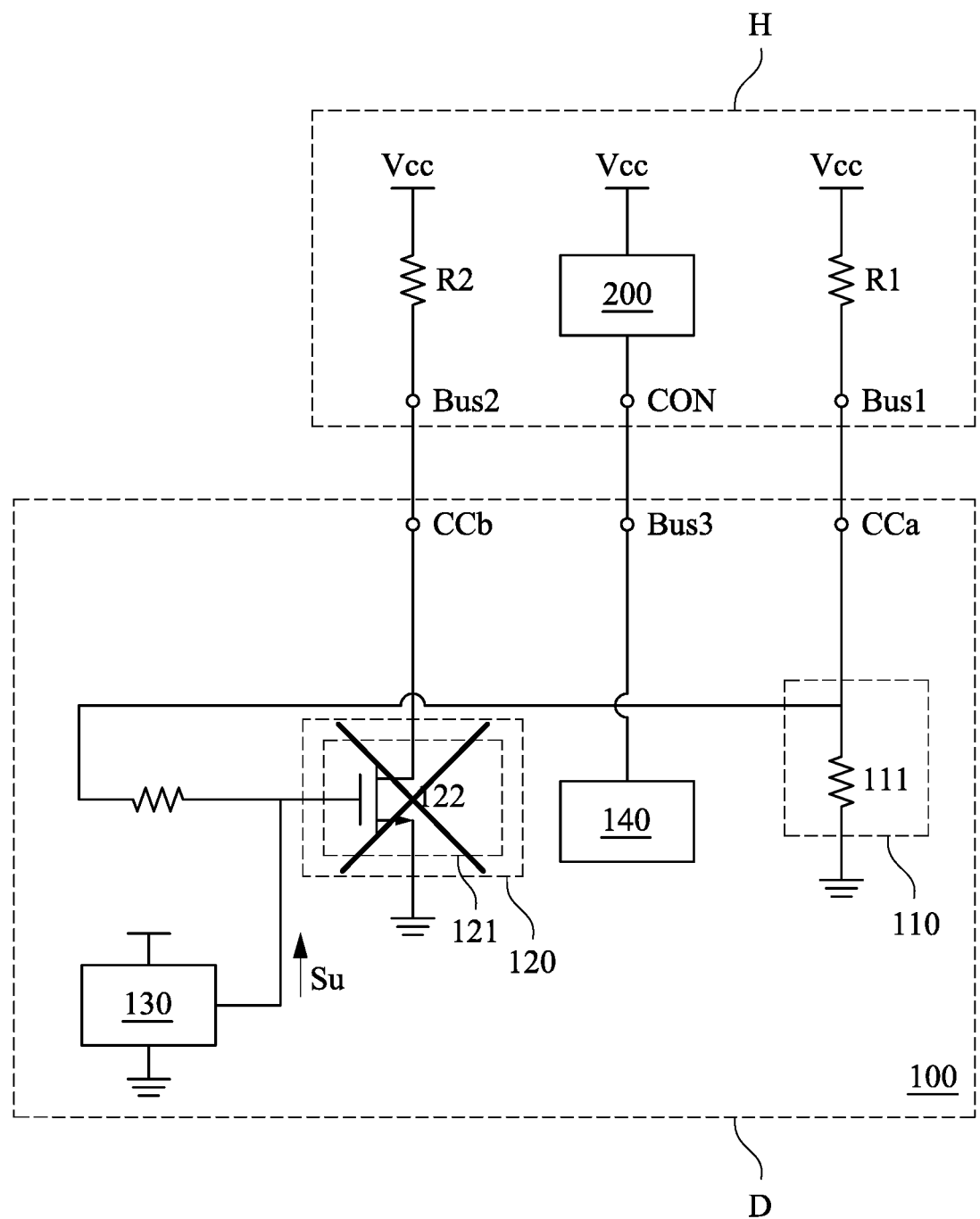
FIG. 2B is a schematic diagram of a connection circuit in the second state in some embodiments of the present disclosure.

The control terminal of the transistor switch 122 is further electrically connected to the switching circuit 130. Referring to FIG. 2B, the switching circuit 130 is configured to generate a disable signal Su. When the switching circuit 130 transmits the disable signal Su to the control terminal of the transistor switch 122, the transistor switch 122 is turned off according to the disable signal Su. At this time, the second circuit 120 will become an open circuit state. In some embodiments, when the external device D must be driven by receiving power from electronic device H, the transistor switch 122 must be turned off. After the electronic device H determines that the second circuit 120 becomes open circuit through the second electrical terminal CCb, then transmits power to the external device D through the power supply circuit 200. Details will be detailed in the following paragraphs.

As shown in FIG. 1, 2A-2B, in some embodiments, the detection circuit of electronic device H includes a first resistor R1 and a second resistor R2. When the electronic device H is electrically connected to the connection circuit 100, the first impedance unit 111 and the second impedance unit 121 are used as pull-down resistors, so that the electronic device H may detect a voltage value of the first detecting terminal Bus1 (or the first electrical terminal CCa) and the second detecting terminal Bus1 (or the second electrical terminal CCb), and determines the type of the external device D. For example, in the case that the switching circuit 130 does not transmit the disable signal Su, the transistor switch 122 in the second impedance unit 121 will be turned on according to the first voltage. At this time, the voltage of the first voltage is about 1.2 volts, and the voltage of the second voltage is 0.1 volts. The electronic device H can determine the type of the external device D such as a headphone.

On the other hand, in the case that the switching circuit 130 transmits the disable signal Su, the transistor switch 122 in the second impedance unit 121 will be turned off according to the disable signal Su. At this time, the voltage of the first voltage is still 1.2 volts, but the second circuit 120 is in the open circuit state, so the voltage of the second voltage on the second detecting terminal Bus1 will be 1.65 volts. Accordingly, the electronic device H may confirm the other type of the external device D, such as the portable device.

After the electronic device H determines the type of external device D, the first electrical terminal CCa and/or second electrical terminal CCb provide power to the external device D.

Since the connection circuit 100 controls the second impedance unit 121 in the second circuit 120 through the switching circuit 130, the connection circuit 100 may be in two different circuit states. The first state is "double pull-down resistors state", the transistor switch 122 will be turned on to have a predetermine impedance value. The second state is "single pull-down resistor state", the transistor switch 122 will be turned off, so that second circuit 120 becomes an open circuit. Accordingly, the connection circuit 100 may be configured in the external device D with different types, so that the connection circuit 100 may be applied more widely, and the operator does not need to select different connection circuits for different types of the external device D.

In some embodiments, the impedance value of the first impedance unit 111 is larger than the impedance value of the second impedance unit 121, so that when the transistor switch 122 is turned on, the first voltage is larger than the second voltage. For example, the impedance value of the first impedance unit 111 is 5000 ohms, and when the transistor switch 122 is turned on, the impedance value of the second impedance unit 121 is less than 1000 ohms. In some embodiments, the first electrical terminal CCa and the second electrical terminal CCb correspond to a Type-C universal serial bus transmission interface.

In some embodiments, the electronic device H includes a comparison circuit (not shown in figure) for detecting the voltage values on the first detecting terminal Bus1 and the second detecting terminal Bus2, respectively. Since those skilled in the art can understand the implementation of the comparison circuit, it will not be described here.

For example, the first electrical terminal CCa and the second electrical terminal CCb are configuration terminals (referred to as "cc terminal") in the Type-C transmission interface. According to the specification of the Type-C transmission interface, if the connection circuit is configured to transmit the audio signal, the pull-down resistors corresponding to the two configuration terminals in the Type-C transmission interface is a large resistance and a small resistance. As shown in FIG. 1, the first impedance unit 111 is a large resistor, and the second impedance unit 121 is a small resistor. Therefore, in the case that the first resistor R1 in the electronic device H is the same as the second resistor R2, the first voltage corresponding to the first impedance unit 111 will be greater than the second voltage corresponding to the second impedance unit 121. As mentioned before, if the second voltage is 0.1 volts, it will not be enough to control the transistor switch 122 to turn on. Therefore, the present disclosure connects the control terminal of the transistor switch 122 to the first circuit 110, so that the transistor switch 122 can be turned on by the high voltage characteristic of the first voltage (e.g., between 1-1.5 volts).

In some embodiments, the transistor switch 122 includes an n-type metal-oxide-semiconductor field-effect transistor (NMOSFET). When the control terminal of the transistor switch 122 receives the disable signal Su, it will be conducted to the ground terminal according to the disable signal Su, so that the transistor switch 122 is turned off.

In some embodiments, the disable signal Su transmitted by the switching circuit 130 is a low level signal for turning off the transistor switch 122. In other embodiments, the switching circuit 130 is a switching circuit implemented by a digital circuit. When the connection circuit 100 needs to be set to "single pull-down resistor state", the switching circuit 130 will be turned on to the ground terminal, and the low level of the ground terminal is disable signal Su, which will cause the transistor switch 122 to be turned off.

In some embodiments, the connection circuit 100 further includes a power circuit 140. The power circuit 140 is electrically connected to at least one third terminal Bus3 of the external device D to be electrically connected to the power supply terminal CON of the electronic device H through the third terminal Bus3. After the electronic device H determines the type of the external device D, the power supply circuit 200 in the electronic device H transmits power to the connection circuit 100 through the power supply terminal CON and the third terminal Bus3 to drive the external device D.

As mentioned above, in some embodiments, in the case that there is no power supply inside the external device D (e.g., headphone), after the third terminal Bus3 receives the power from the electronic device H and transmits the power to the power circuit 140, if the external device D determines that the connection circuit 100 should be in the "single pull-down resistor state", the power circuit 140 provides the power to the switching circuit 130, so that the switching circuit 130 generates a disable signal Su by the power provided by the power circuit 140.

As shown in FIG. 1, in some embodiments, the connection circuit 100 further includes a third impedance unit R3. The second circuit 120 is electrically connected to the third impedance unit R3. The control terminal of the transistor switch 122 is electrically connected to the first circuit 110 through the third impedance unit R3. The impedance value (e.g., one million ohms) of the third impedance unit R3 is much larger than the impedance value of the first impedance unit 111. Accordingly, the leakage current problem of the control terminal of the transistor switch 122 when the transistor switch 122 is turned off according to the disable signal Su can be avoided.

In some embodiments, the electronic device H stores a judgment table to determine the type of the external device D according to the detected voltage values of the first detecting terminal Bus1 and the second detecting terminal Bus1. Referring to Table 1 to Table 3 below for the judgment table of electronic device H under different circumstances. The first voltage is the voltage value of the first detecting terminal Bus1 or the first electrical terminal CCa. The second voltage is the voltage value of the second detecting terminal Bus1 or the second electrical terminal CCb (the unit in the table is volts). Table 1 shows the electronic device H used in the default USB transmission standard: 0.5 amps, 5 volts for power supply. Table 2 shows the transmission standard: 1.5 amps, 5 volts. Table 3 shows the transmission standard: 3 amps, 5 volts.

TABLE 1

|  | Low standard for determining | High standard for determining | Threshold value for determining |
|---|---|---|---|
| The second voltage | 0.00 | 0.15 | 0.20 |
| The first voltage | 0.25 | 1.50 | 1.60 |
| The open circuit voltage |  | 1.65 |  |

TABLE 2

|  | Low standard for determining | High standard for determining | Threshold value for determining |
|---|---|---|---|
| The second voltage | 0.00 | 0.35 | 0.40 |
| The first voltage | 0.45 | 1.50 | 1.60 |
| The open circuit voltage |  | 1.65 |  |

TABLE 3

|  | Low standard for determining | High standard for determining | Threshold value for determining |
|---|---|---|---|
| The second voltage | 0.00 | 0.75 | 0.80 |
| The first voltage | 0.85 | 2.45 | 2.60 |
| The open circuit voltage |  | 2.75 |  |

As shown in Table 1 to Table 3, when the first voltage is between the low standard and the high standard, the electronic device H confirms that the first circuit 110 is turned on. Similarly, when the second voltage is between the low standard and the high standard, the electronic device H confirms that the second circuit 120 is turned on. If the first voltage and the second voltage are both larger than the threshold value, or equal to the open circuit voltage, the electronic device H confirms that first circuit 110 or second circuit 120 is in an open circuit state.

Figure 3:
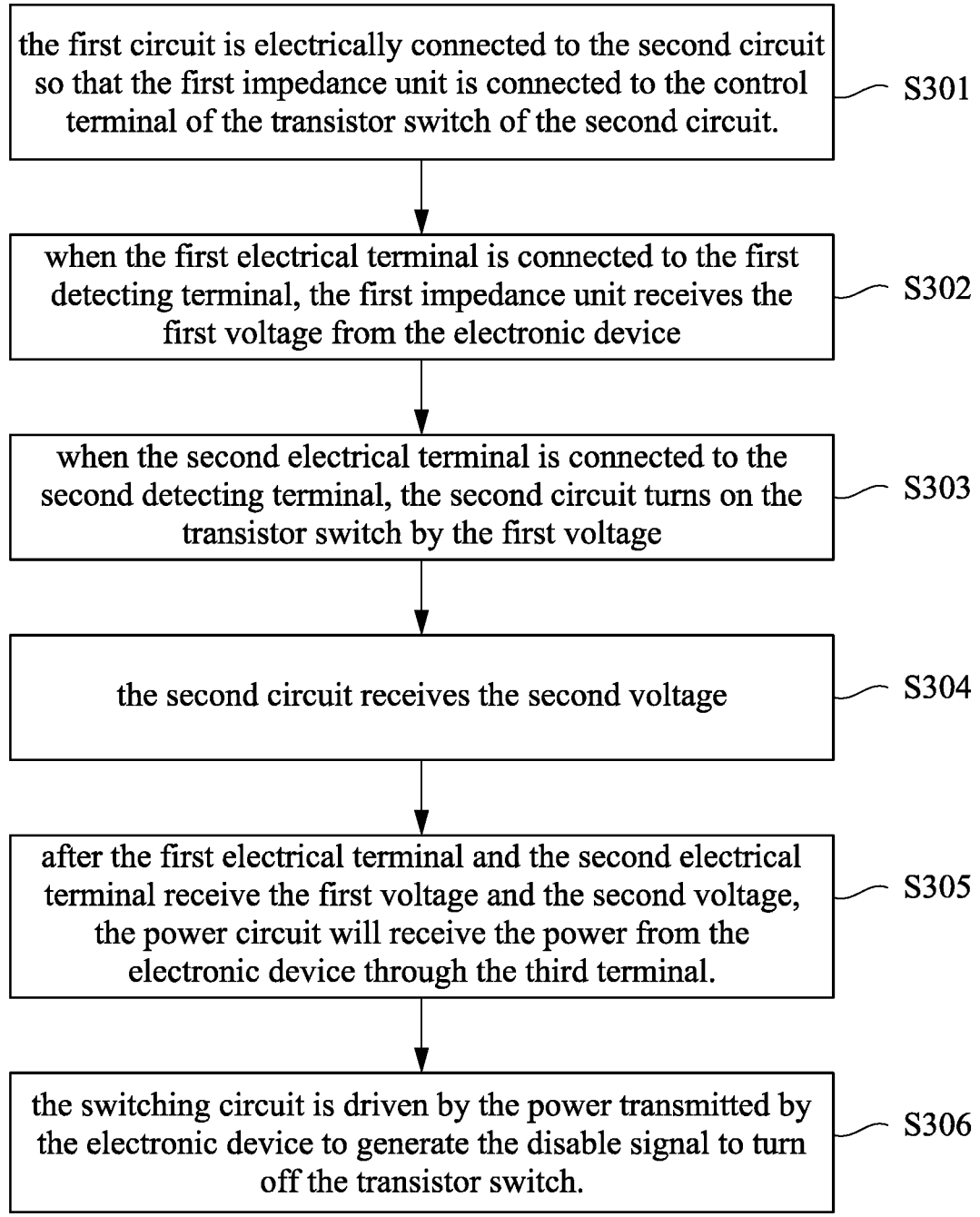
FIG. 3 is a flowchart illustrating a connection method in some embodiments of the present disclosure.

Referring to FIG. 3, here is the connection method when connection circuit 100 is operating. In step S301, the first circuit 110 is electrically connected to the second circuit 120 so that the first impedance unit 111 of the first circuit 110 is connected to the control terminal of the transistor switch 122 of the second circuit 120.

In step S302, when the first electrical terminal CCa is connected to the first detecting terminal Bus1, the first impedance unit 111 receives the first voltage from the electronic device H. In step S303, when the second electrical terminal CCb is connected to the second detecting terminal Bus1, the second circuit 120 turns on the transistor switch 122 by the first voltage. Next, in step S304, the second circuit 120 receives the second voltage.

In step S305, after the first electrical terminal CCa and the second electrical terminal CCb receive the first voltage and the second voltage, respectively, if the connection circuit 100 determines that it should be set to "single pull-down resistor state", the power circuit 140 will receive the power from the electronic device H through the third terminal Bus3. In step S306, the switching circuit 130 is driven by the power transmitted by the electronic device to generate the disable signal Su, and transmits the disable signal Su to the control terminal of the transistor switch 122 to turn off the transistor switch 122.

It will be apparent to those skilled in the art that various modifications and variations can be made to the structure of the present disclosure without departing from the scope or spirit of the present disclosure. In view of the foregoing, it is intended that the present disclosure cover modifications and variations of this present disclosure provided they fall within the scope of the following claims.

What is claimed is:

1. A connection circuit, comprising:
a first circuit comprising a first impedance unit, wherein the first impedance unit is electrically connected to a first detecting terminal of an electronic device to receive a first voltage; and
a second circuit comprising a second impedance unit, wherein the second impedance unit is electrically connected to a second detecting terminal of the electronic device to receive a second voltage; the second impedance unit comprises a transistor switch, a control terminal of the transistor switch is electrically connected to the first circuit, so that the transistor switch is turned on according to the first voltage;
wherein an impedance value of the first impedance unit is larger than an impedance value of the second impedance unit, so that when the transistor switch is turned on, the first voltage is larger than the second voltage.

2. The connection circuit of claim 1, wherein the control terminal of the transistor switch is electrically connected to a switching circuit, when the switching circuit has a disable signal, the transistor switch is turned off according to the disable signal.

3. The connection circuit of claim 2, further comprising:
a power circuit configured to receive a power from the electronic device, and the switching circuit generates the disable signal according to the power from the electronic device.

4. The connection circuit of claim 2, wherein the transistor switch comprises an n-type metal-oxide-semiconductor field-effect transistor.

5. The connection circuit of claim 4, wherein the control terminal of the transistor switch is conducted to a ground terminal according to the disable signal, so that the transistor switch is turned off.

6. The connection circuit of claim 5, wherein when the transistor switch is turned off, the second circuit becomes open circuit.

7. The connection circuit of claim 1, wherein the second circuit is further electrically connected to a third impedance unit, the control terminal of the transistor switch is electrically connected to the first circuit through the third impedance unit.

8. The connection circuit of claim 7, wherein an impedance value of the third impedance unit is larger than the impedance value of the first impedance unit.

9. The connection circuit of claim 1, wherein the first circuit is electrically connected to a first electrical terminal, the second circuit is electrically connected to a second electrical terminal, the first electrical terminal and the second electrical terminal correspond to a Type-C universal serial bus transmission interface.

10. A connection method for a connection circuit, comprising:
electrically connecting a first circuit and a second circuit, so that a first impedance unit of the first circuit is electrically connected to a control terminal of a transistor switch of the second circuit, wherein the second circuit comprises a second impedance unit;
receiving a first voltage from an electronic device through the first impedance unit;
turning on the transistor switch according to the first voltage; and
receiving a second voltage from the electronic device through the second circuit, wherein an impedance value of the first impedance unit is larger than an impedance value of the second impedance unit, so that when the transistor switch is turned on, the first voltage is larger than the second voltage.

11. The connection method of claim 10, further comprising:
transmitting a disable signal to the control terminal of the transistor switch through a switching circuit to turn off the transistor switch.

12. The connection method of claim 11, further comprising:
receiving a power from the electronic device through a power circuit after receiving the first voltage and the second voltage; and
driving the switching circuit to generate the disable signal according to the power from the electronic device.

* * * * *